US011333682B2

(12) United States Patent
Zhu et al.

(10) Patent No.: US 11,333,682 B2
(45) Date of Patent: May 17, 2022

(54) SILICON PROBE FOR MILLIMETER-WAVE AND TERAHERTZ MEASUREMENT AND CHARACTERIZATION

(71) Applicants: Haotian Zhu, Nanjing (CN); Ke Wu, Saint-Laurent (CA); Jules Gauthier, Laval (CA)

(72) Inventors: Haotian Zhu, Nanjing (CN); Ke Wu, Saint-Laurent (CA); Jules Gauthier, Laval (CA)

(73) Assignee: HUAWEI TECHNOLOGIES CANADA CO., LTD., Kanata (CA)

( * ) Notice: Subject to any disclaimer, the term of this patent is extended or adjusted under 35 U.S.C. 154(b) by 145 days.

(21) Appl. No.: 16/817,747

(22) Filed: Mar. 13, 2020

(65) Prior Publication Data

US 2021/0285985 A1 Sep. 16, 2021

(51) Int. Cl.
*G01R 1/067* (2006.01)
(52) U.S. Cl.
CPC ....... *G01R 1/0675* (2013.01); *G01R 1/06755* (2013.01); *G01R 1/06794* (2013.01)
(58) Field of Classification Search
CPC .............. G01R 1/0675; G01R 1/06755; G01R 1/06794; G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735;
(Continued)

(56) References Cited

U.S. PATENT DOCUMENTS

| 6,617,241 B1 * | 9/2003 | Doan ................ H01L 21/31053 257/E21.244 |
| 10,100,858 B2 | 10/2018 | Jung-Kubiak et al. |
| 2015/0295299 A1 | 10/2015 | Herbsommer |

(Continued)

FOREIGN PATENT DOCUMENTS

WO WO2014060648 A1 4/2014

OTHER PUBLICATIONS

Andreas Patrovsky et al "Substrate Integrated Image Guide (SIIG)—A Planar Dielectric Waveguide Technology for Millimeter-Wave Applications"; IEEE Transactions On Microwave Theory and Techniques, vol. 54, No. 6, Jun. 2006.

(Continued)

*Primary Examiner* — Lee E Rodak

(57) ABSTRACT

A probe includes a first rod having a first axis and a second rod having a second axis. A first end of the first rod is connected to a first end of the second rod to form an angle that maintains a "total internal reflection" effect for waves propagating through the probe. A second end of the second rod includes a prong facilitating attachment of the probe to a housing block. The first axis and the second axis define a plane. A second end of the first rod includes a tapered face formed perpendicular to the plane. The tapered face is sufficiently flat to make planar contact with a portion of a component under study. A support is formed in the plane and connected to the second rod. A second end of the support includes a connector to facilitate attachment of the probe to the housing block.

21 Claims, 15 Drawing Sheets

(58) Field of Classification Search
CPC ............ G01R 1/07357; G01R 1/07364; G01R 1/07371; G01R 1/07378; G01R 1/07385; G01R 1/07392
See application file for complete search history.

(56) References Cited

U.S. PATENT DOCUMENTS

2018/0241128 A1   8/2018   Wue et al.
2018/0246279 A1*  8/2018   Florian Lohse ..... G02B 6/1228

OTHER PUBLICATIONS

Bo Yu et ak "Ring-Resonator-Based Sub-THz Dielectric Sensor"; IEEE Microwave and Wireless Components Letters, vol. 28, No. 11, Nov. 2018.

Theodore J. Reck et al "Micromachined Probes for Submillimeter-Wave On-Wafer Measurements—Part II: RF Design and Characterization"; IEEE Transactions On Terahertz Science and Technology, vol. 1, No. 2, Nov. 2011.

Theodore J. Reck et al "Micromachined Probes for Submillimeter-Wave On-Wafer Measurements—Part I: Mechanical Design and Characterization"; IEEE Transactions On Terahertz Science and Technology, vol. 1, No. 2, Nov. 2011.

Nemat Dolatsha et al "Millimeter-Wave Chip-to-Chip Transmission Using an Insulated Image Guide Excited by an On-Chip Dipole Antenna at 90 GHz"; IEEE Microwave and Wireless Components Letters, vol. 22, No. 5, May 2012.

Hao-Tian Zhu et al "Determination of Propagation Constant of Terahertz Dielectric Ridge Waveguide Using Noncontact Measurement Approach"; IEEE Transactions On Instrumentation and Measurement, vol. 66, No. 8, Aug. 2017.

Andreas Patrovsky et al "94-GHz Broadband Transition from Coplanar Waveguide to Substrate Integrated Image Guide (SIIG)"; in Proc. 2007, IEEE MTT-S Int. Microwave Symp. Dig., pp. 1551-1554.

* cited by examiner

| Structure for $E_{11}^y$ mode | Value (dB) |
|---|---|
| Housing block 300 | 0.8 |
| Second rod 145 | 1.6 |
| Angle 130 | 1.4 |
| First rod 110 | 2 |
| Total | 5.8 |

Table I: Losses in a silicon probe at 200 GHz

SILICON PROBE FOR MILLIMETER-WAVE AND TERAHERTZ MEASUREMENT AND CHARACTERIZATION

FIELD OF THE INVENTION

This invention pertains generally to the field of microwave and terahertz waveguides and in particular, to an apparatus and a method for measuring and characterizing waveguides using the apparatus.

BACKGROUND OF THE INVENTION

Millimeter wave (mmW) and terahertz frequency (THz) technologies are increasingly being used in communication systems. Due the A successful deployment of these technologies and systems requires production of a number of very small and delicate components. Characterization of these components requires accurate measurement without damaging the components.

Due to their low cost, low loss, and ease of integration into planar topologies, dielectric waveguides are good candidates for mmW and THz circuits and antenna applications. Characterization and measurement devices for mmW and THz dielectric components can be done using either non-contact methods or contact methods.

Almost all non-contact methods rely on quasi-optical path designs that are bulky, inconvenient and require precise adjustments. As a result they are not as practical for testing in a mass production environment as would be desired. Contact methods generally involve the insertion of the dielectric waveguide under test into a rectangular waveguide, which has the drawback that testing becomes difficult as the testing frequency is increased.

In the field of radio-frequency (RF) circuits, a traditional method to measure component properties is to use a probe. However, the smaller scale of mmW and THz components, makes the development of corresponding probes difficult because mechanical precision, electrical reliability and low-loss transmission become increasingly difficult to achieve.

While commercially available ground-signal-ground (GSG) probes are available for signals of up to 1 THz, a drawback of these is that the propagation mode within a GSG probe is transverse electro-magnetic (TEM), while the propagation modes in both the source and in the waveguide are not. Two mode transitions are therefore required: A first transition to couple the $TE_{10}$ (transverse electric of the first order) mode of the frequency extender output to the TEM mode of the GSG probe, and a second transition designed to couple the TEM mode of the GSG probe to the $E_{11}^x$ or $E_{11}^y$ (component of an electric field wave's first order mode along either side x or y of a waveguide) mode of the dielectric waveguide. To reduce the transition loss, and to eliminate any $E_z$ component (an electric field component along the propagation direction) throughout the setup, a single transition coupling would be preferable.

Therefore, there is a need for a method and apparatus for an improved probe for millimeter-wave and terahertz measurement and characterization that obviates or mitigates one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

The present invention relates to a probe to transfer the electromagnetic wave modes from a signal source to a component under study such as a dielectric waveguide. Probes according to embodiments reduce the number of mode transitions in the test measurement system, thereby reducing the power loss of the test signal caused by transitions. When in use, probes are attached to a housing block that positions a tapered face of the probe tip on an input portion of the waveguide under study. The probe receives a test signal through the housing block and the "total internal reflection" effect transfers the signal along the probe. If the probe contains a bend having an appropriate angle, the signal will be guided towards the tapered face with minimal loss, where it can be transferred to the waveguide under study.

In accordance with embodiments of the present invention, there is provided a probe. The probe includes a first rod having a first axis and a second rod having a second axis. A first end of the first rod is connected to a first end of the second rod to form an angle. The angle maintains a "total internal reflection" effect for waves propagating through the probe. A second end of the second rod includes a prong. The prong facilitates attachment of the probe to a housing block. The first axis and the second axis define a plane. A second end of the first rod includes a tapered face formed perpendicular to the plane. The tapered face is sufficiently flat to make planar contact with a portion of a component.

A further embodiment includes a support formed in the plane. A first end of the support is connected to the second rod and includes a connector to facilitate attachment of the probe to the housing block. In some embodiments, the first rod and the second rod are composed of a material transparent to the waves. In some embodiments, the waves are of wavelengths from microwave to optical radiation. In some embodiments, the first rod and the second rod have a rectangular cross section. In further embodiments, the housing block has a first channel cavity and a second channel cavity formed within. The first channel cavity is shaped to receive the prong and the second channel cavity is shaped to receive the connector. In some embodiments the housing block has an outer geometry allowing the housing block to be fastened to a positioning system. The positioning system is to position the tapered face to be in planar contact with the portion of the component and to allow for the transmission of the waves from the tapered face to the portion of the component.

In some embodiments, with the prong inserted into the first channel cavity, a gap is formed between an outer surface of the prong and the first channel cavity. The gap allows an amount of movement of the prong, so as to reduce the risk that the probe ruptures when the tapered face is positioned in planar contact with the portion of the component. In other embodiments, with the connector inserted into the second channel cavity, a gap is formed between an outer surface of the connector and the second channel cavity. The gap is chosen to allow an amount of movement of the connector, so as to reduce the risk that the probe ruptures when the tapered face is positioned in planar contact with the input portion of the component. In some embodiments, the width of the prong narrows in a direction of the second end of the second rod. In some embodiments, the material comprises dielectric silicon. In some embodiments, the thickness of the rectangular cross-section is between 0.1 mm and 3 mm. In some embodiments, the angle is between 0 and 20 degrees. In some embodiments, the support is connected to the second rod at a 90-degree angle. In some embodiments, the connector is shaped to prevent movement of the probe in the direction of the second axis when the probe is attached to the housing block.

In accordance with embodiments of the present invention, there is provided a method to measure the properties of a component at a range of frequencies. The method includes fastening a probe to a housing block. The probe has a first rod having a first axis and a second rod having a second axis. T first end of the first rod is connected to a first end of the second rod to form an angle. The angle maintains a "total internal reflection" effect for waves propagating through the probe. A second end of the second rod includes a prong facilitating attachment of the probe to the housing block. The first axis and the second axis defining a plane. A second end of the first rod includes a tapered face formed perpendicular to the plane. The tapered face is sufficiently flat to make planar contact with a portion of a component. The method continues with fastening the housing block to a positioning system, manipulating the positioning system to position the tapered face to make planar contact with the portion of the component, apply a test signal including the waves to the positioning system, measuring properties of the test signal exiting the component, and comparing properties of the test signal exiting the component with properties of the test signal.

Further embodiments of the method include positioning a tilt mirror to capture an image of an interface between the tapered face and the portion of the component, and manipulating the positioning system to position the tapered face to reduce a distance between the tapered face and the portion of the component.

In a further aspect of the present invention, there is provided a probe for transmitting a test signal having a predetermined wavelength into a waveguide. The probe comprises first and second segments. The first segment is composed of a dielectric material. The first probe has an associated a thickness, a central axis and a face set at a bias to the central axis of the first segment. The face is at a first end of the first segment. The second segment is composed of the same dielectric material as the first segment. It also a thickness and a central axis. A first end of the second segment is connected to a second end of the first segment, the second end of the first segment is distal to the first end of the first segment. The central axes of the first and second segments form an intersection having an angle of intersection. The dielectric constant associated with the dielectric material and the thickness of the second segment are selected in accordance with the predetermined wavelength to permit total internal reflection of the test signal when propagated through the second segment. The thickness of the first segment and the angle of intersection are selected in accordance with the predetermined wavelength to permit total internal reflection of the test signal propagated through the second segment into the first segment. The angle between the face set at a bias and the central axis of the first segment is selected to permit transmission of the test signal into the waveguide.

In an embodiment of this aspect, the first and second segments are composed of a silicon-based dielectric material and the thickness of the second segment is the same as the thickness of the first segment. In another embodiment, the angle between the face set at a bias and the central axis of the first segment is further selected to permit transmission out of the first segment of a reflection associated with transmission of the test signal into the waveguide. In a further embodiment, the first and second segments are integrally formed. In a further embodiment, the second segment has, at a second end, distal to the first end of the second segment, a connector end for interfacing the probe with a housing, wherein the connector end is shaped for insertion into the housing.

Embodiments have been described above in conjunctions with aspects of the present invention upon which they can be implemented. Those skilled in the art will appreciate that embodiments may be implemented in conjunction with the aspect with which they are described, but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

DETAILED DESCRIPTION OF THE INVENTION

Embodiments of the present invention relate to a probe for the testing of communications components, such as dielectric waveguides. Embodiments also relate to a test system that utilizes the probe to test dielectric waveguides, and a method of testing, characterizing, or studying dielectric waveguides using the test system. The probe is able to transfer the electromagnetic (EM) wave modes of a test signal received from a signal source to electromagnetic wave modes of a dielectric waveguide under study such that intermediary and additional mode transitions do not occur. Similarly, the probe may be used to transfer the electromagnetic wave modes of a test signal received from waveguide under study to a measurement system. This decreases the energy and power loss associated with mode transitions that occur when using other types of probes. Embodiments also include a housing block to securely hold and support the probe and accurately position the tapered face of the probe onto a waveguide under study.

Embodiments of the invention may be used to characterize, study, or test a waveguide. The waveguide under study may be a dielectric rigid waveguide, a dielectric microstrip line (DML), a substrate integrated image guide (SIIG), a U-silicon-on-glass waveguide, or other similar component.

In embodiments, electromagnetic waves are transmitted through the probe and transferred to the waveguide under study. These electromagnetic waves may have a generally contiguous frequency range containing microwave frequencies at one end of the range and optical frequencies at the other. The electromagnetic waves may have a frequency range lying in the spectrum commonly known as the millimetre (mmW) spectrum, a frequency range lying in the spectrum commonly known as the terahertz (THz) spectrum, or in a frequency range between the low end of the mmW spectrum and the high-end of the THz spectrum.

In embodiments, the probe is composed of a material sufficiently transparent to the wavelengths of waves suitable to study the waveguide component. In some embodiments, the probe is composed of a solid dielectric material which may be dielectric silicon. In this case, the probe may also be referred to as a silicon-base dielectric waveguide (SiDW). The probe may be manufactured from a piece of dielectric silicon having uniform thickness, such as a silicon wafer. Techniques such as etching or cutting can be used to from the probe from the silicon so that the probe also has a uniform thickness substantially the same as the wafer from which it is cut.

Figure 1:
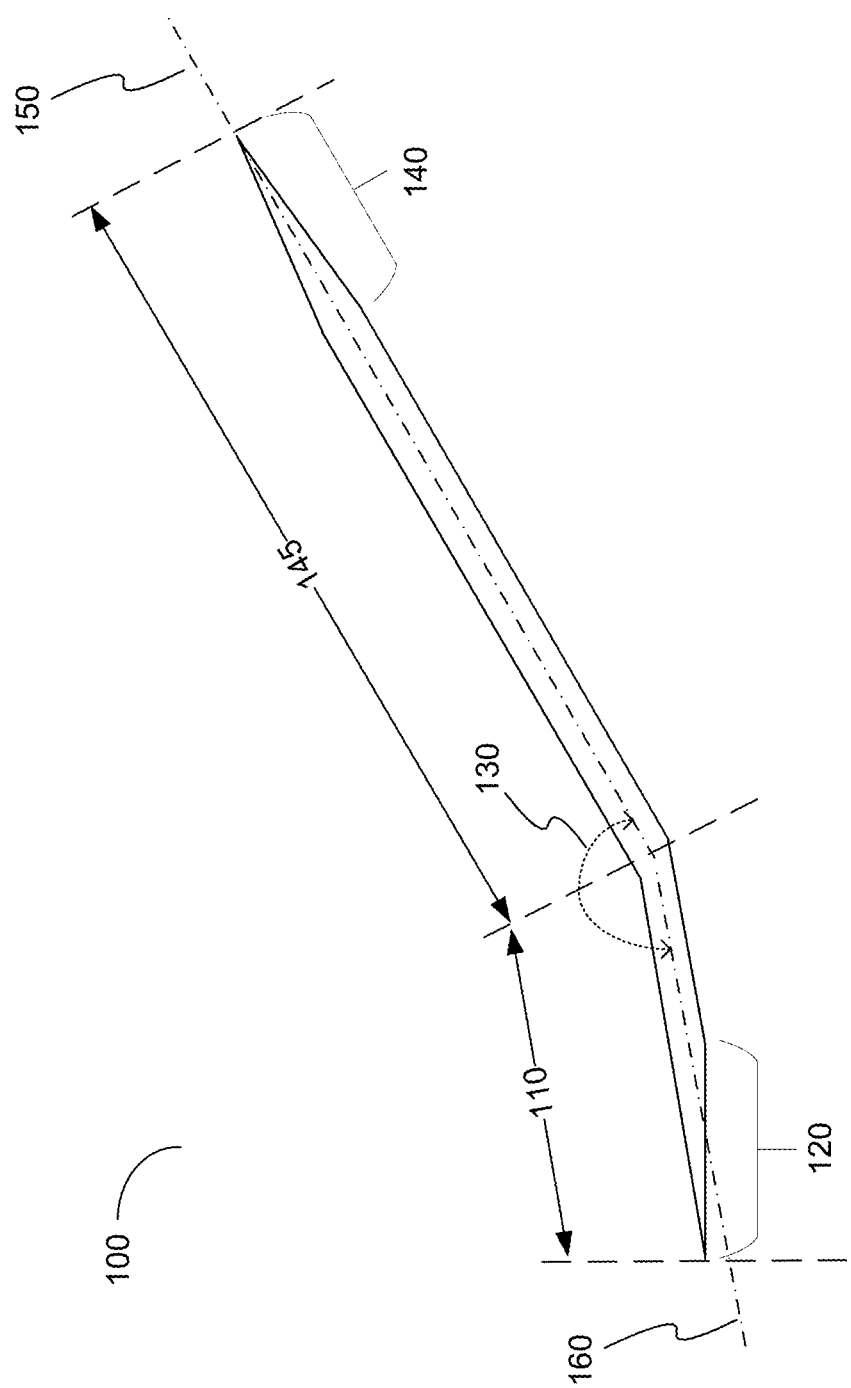
FIG. 1 illustrates an embodiment a probe and its key features.

FIG. 1 illustrates an embodiment of a probe 100. A first rod 110 and a second rod 145 are joined to form the probe. When joined, the axis of the first rod 160 and the axis of the second rod 150 form an angle 130. The first rod comprises a flat, tapered face 120 at its tip. The second rod 145 ends with a prong 140. If the probe 100 is formed from a material having a uniform thickness, such as a silicon wafer, it may have a rectangular cross section in the direction perpendicular to its axis 150 and 160. In some embodiments, the rectangular cross-section may have a width and a thickness of approximately one millimeter.

The tapered face 120 is located at the end of the probe 100 and makes contact with a waveguide under study. The tapered face 120 is formed to have a generally flat or planar surface. The tapered face 120 allows the probe 100 to form a transmission coupling interface with a portion of a waveguide under study. The tapered face 120 has a flatness or planarity that is formed to maximize electromagnetic transmission when it is touching, or coupled to, an adjacent waveguide. To ensure sufficient flatness, after forming tapered face 120, it may be further flattened through any of a variety of techniques including any one or more of tooling, grinding, and polishing. The tapered face 120 is angled with respect to the axis of the first rod 110 such as to accommodate the geometry of an adjacent waveguide under study, and to maximize electromagnetic transmission when it is touching, in direct contact, or coupled to, an input portion of an adjacent waveguide under study.

The depth, also referred to as the thickness of the waveguide, is sized to allow for the electromagnetic waves to travel through the probe. Due to the angle between the axis 160 and the face 120 the EM waves are able to reflect off the upper and lower (top and bottom) edges of the waveguide and be transferred into the test object. By ensuring that there is a sufficient match between the dielectric constant of the probe and the wavelength of the EM waves used in testing, total internal reflection of the wave in the probe can be achieved. This allows for a reduction in the losses that would otherwise be experienced.

The angle 130 in the probe 100 is formed such that the total internal reflection effect is maintained before and after the bend at the junction of the first rod 110 and the second rod 145 and energy loss through the probe 100 are thereby very small or negligible. When the total internal reflection effect is maintained, the wave energy is generally confined within the lateral boundaries of the probe 100 and directed axially to the probe's extremities. Constraints of the angles and dimensions of the angle 130 are detailed below.

The prong 140 is located at the end of the probe 100 distant from the tapered face 120. The prong 140 may gradually narrow towards the extremity of the probe, such as to form a generally sharp point in order to minimize transfer loss of a test signal being transferred between the probe 100 and a housing block. In some embodiments of the present invention, the prong 140 has a rectangular cross-section of approximately 0.915 mm by 0.500 mm.

Although discussed above as first rod 100 and second rod 145, it is important to understand that in production of the probe 100, it is not necessary to create two rods and then fuse them together. An integral construction of probe 100 provides many advantages including a uniform distribution of material, and avoidance of any seams. Some descriptions would refer to probe 100 as being composes of first and second segments, arranged along intersecting axes. The first segment has, at an end distal to the connection to the second segment, a face set at a bias to the axis of the first segment. The second segment has, at an end distal to the connection to the first segment a connector end for interfacing with a housing. The shaping of the connector end is designed to mate with the house and reduce possible loss of the test signal. The intersection between the first and second segments forms an angle, referred to as an angle of intersection. The angle of intersection is a function of the wavelength of the intended testing wave (or the frequency of the testing signal) and the dielectric of the material which the probe is made from. The thickness of the probe is also a function of these two variables. As will be illustrated below with respect to FIG. 6, a testing signal is propagated through the probe and into the waveguide under study. The signal is introduced into the second segment 145 at an angle such that it will reflect off one of the upper and lower surfaces of the probe. By ensuring that the angle at which the signal hits the upper or lower surface, given the test signal wavelength and the dielectric of the probe, will result in total internal reflection, losses due to propagation in the second segment will be reduced, if not eliminated. The angle of intersection 130 between the first and second segments is selected to ensure that total internal reflection is maintained as the test signal is propagated into the first segment 110. The angle of the bias at which face 120 is cut with respect to axis 160, is selected so that the signal can be coupled into the waveguide under study. Understanding that any coupling into the waveguide under study will not be perfect, an accommodation for a reflection off the inside of face 120 must be made. Because of the change in the angle at which a reflection will be sent with respect to the axis because of the bias of face 120, the reflected test signal incident upon the upper side of the first segment, will not result in total internal reflection. Instead the test signal reflected off the waveguide under study will exit the probe. This reduces the loss of the test signal greatly, and the sum of the losses may be characterised by the dominating term of the power of the signal that is reflected off the waveguide under test.

Figure 2:
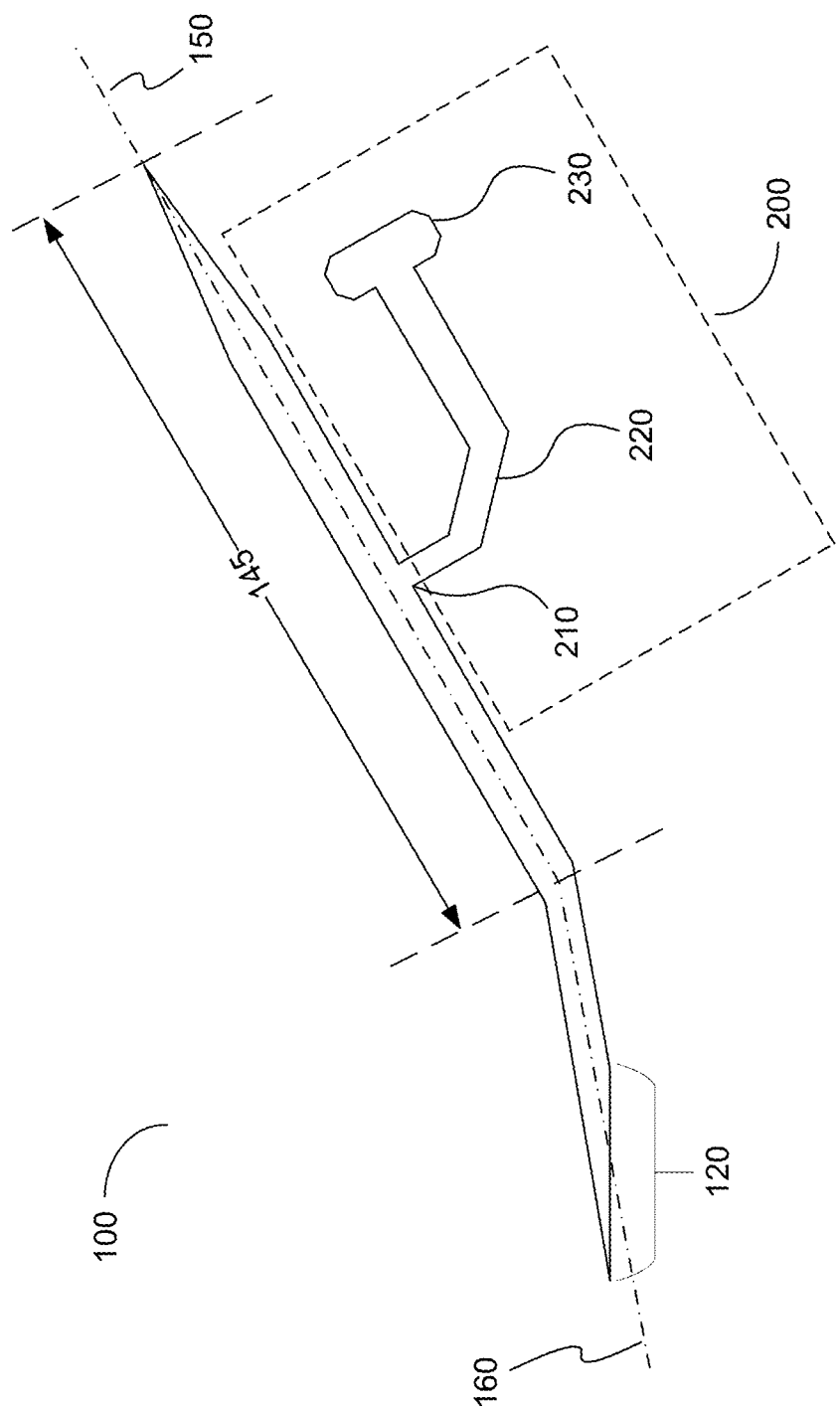
FIG. 2 illustrates an embodiment of a probe which includes an additional portion of a supporting and connecting arm.

FIG. 2 illustrates an embodiment of a probe 100 having an additional support portion 200, as shown in the dashed box, to support and maintain the probe 100 in position when in use in a test system. The support 200 includes a junction, such as a T-junction 210, a curved or angular section 220, and an extension terminating with a connector 230. When the support 200 is formed from the same flat piece of material as the probe 100, such as a silicon wafer, the support 200 will be formed in the plane formed by the first axis 160 and the second axis 150, and perpendicular to the plane of the tapered face 120 of the probe 100.

The T-junction 210 connects the support to the second rod 145 of the probe 100 between the angle 130 and the prong 140, such that an extension protrudes from the probe 100 in the plane formed by the first axis 160 and the second axis 150. In embodiments the T-junction 210 forms a 90-degree angle with the second axis 150 of the probe 100 in order to minimize loss of a test signal in the probe 100 being transferred between the prong 140 and the tapered face 120. The curved section 220 provides a link between the T-junction 210 and the connector 230. The connector 230 is of a shape that may be held in a housing block to secure the prong 140 within the housing block. The connector 230 may be in the shape of a "T" but may also be other shapes such as a circle, sphere, or any other shape suitable to secure the probe 100 in a housing.

Figure 3:
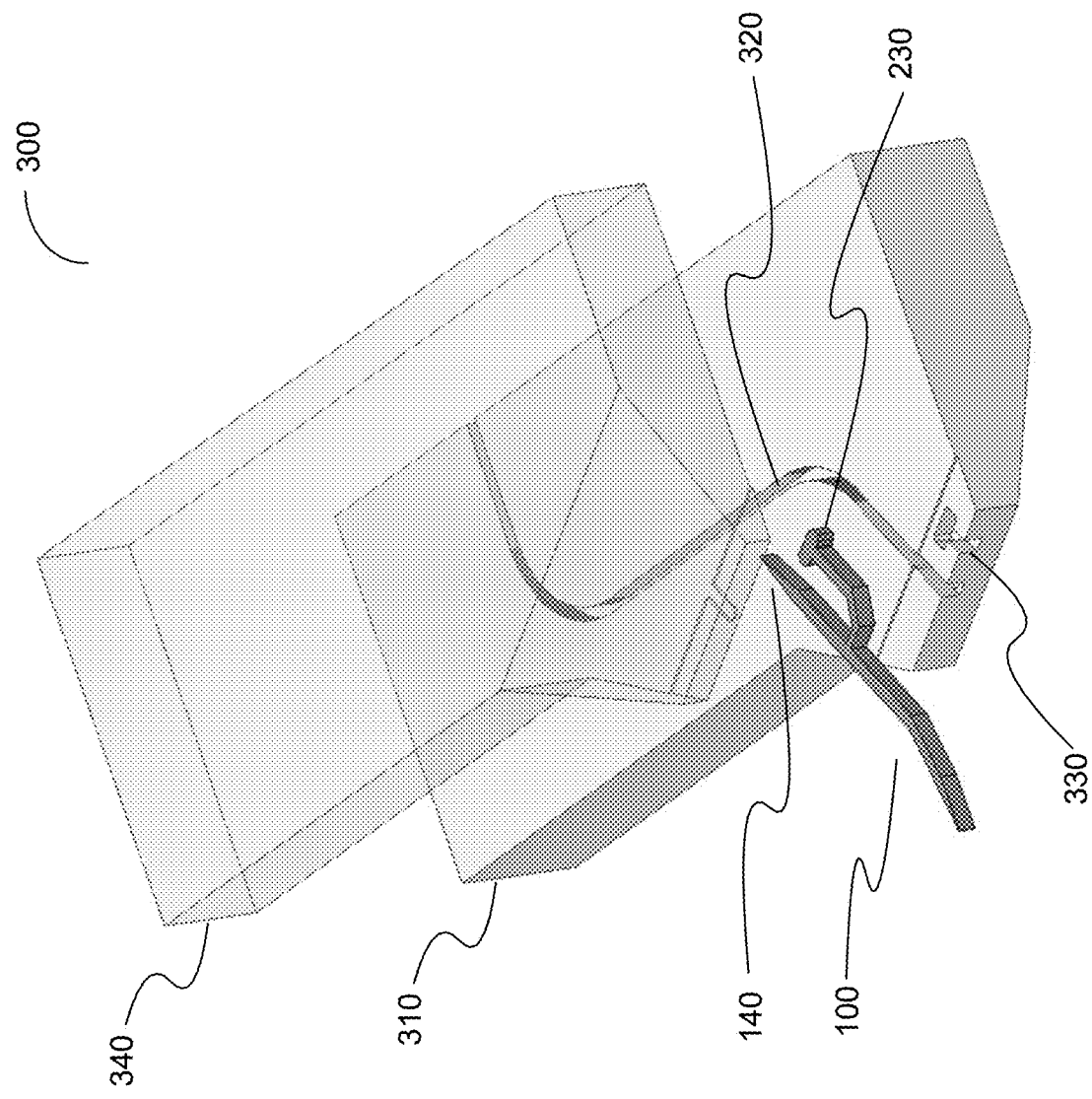
FIG. 3 illustrates a housing block in which channels have been formed to accommodate a probe, as well to transmit electromagnetic waves to the probe.

When in use in a test apparatus, the probe 100 is connected to a housing block 300 as illustrated in FIG. 3. The housing block serves several functions:

The housing block 300 mechanically receives and secures the probe 100 such that the tapered face 120 of the probe 100 can be positioned accurately on the waveguide under study.

The housing block 300 mechanically receives the connector 230 in order to support the probe 100 and secure the probe 100 in place within the housing block 300. With the connector 230 secured in the housing block 300, the movement of the probe in the direction of the second axis 150 is constrained.

The housing block directs a test wave signal from a source to the supported probe 100 through a cavity channel 320 tooled inside the block.

In embodiments the housing block 300 is composed of a solid material that can be formed to accommodate the probe 100 and form a fixed assembly comprising both the housing block 300 and the probe 100. The solid material chosen may be a metallic material that can be tooled to form a waveguide that can direct a test signal of electromagnetic waves in the mmW and THz range to the prong 140 of the probe 100. The metallic material may be an aluminium alloy which is both mechanically solid and electromagnetically capable of confining mmW and THz waves in channel cavities tooled within. The housing block 300 may be made of two connectable parts, such that the probe 100 can be inserted in the cavity channel of a first part 310, and encapsulated with the second part 340, such that the second part can act to prevent the probe 100 from slipping out of the channel cavities. The first part 310 of the housing block 300 may have a first channel cavity 320 that serves as a mechanical support for the prong 140, and transfers electromagnetic energy in the mmW or THz ranges. In some embodiments, the first channel cavity 320 is enhanced with a standard waveguide port known as a WR5.1 waveguide port, thereby facilitating input of known electromagnetic waves. The first part 310 may also tooled with a second channel 330 for accommodating connector 230 of the support 200, such that when the connector 230 is inserted in the second channel 330, their matching geometry causes the connector 230 to be secured within the housing block forming a single assembly. A second part 340 for the housing waveguide block is attached to the first part 310 to ensure that wave energy is confined within the first channel cavity 320 and transferred to the prong 140 with minimal loss. Alternatively, the first part 310 and the second part 340 may both be formed so that the first channel cavity 320 and the second channel 330 are partially formed within the first part 310 and the second part 340.

Figure 4:
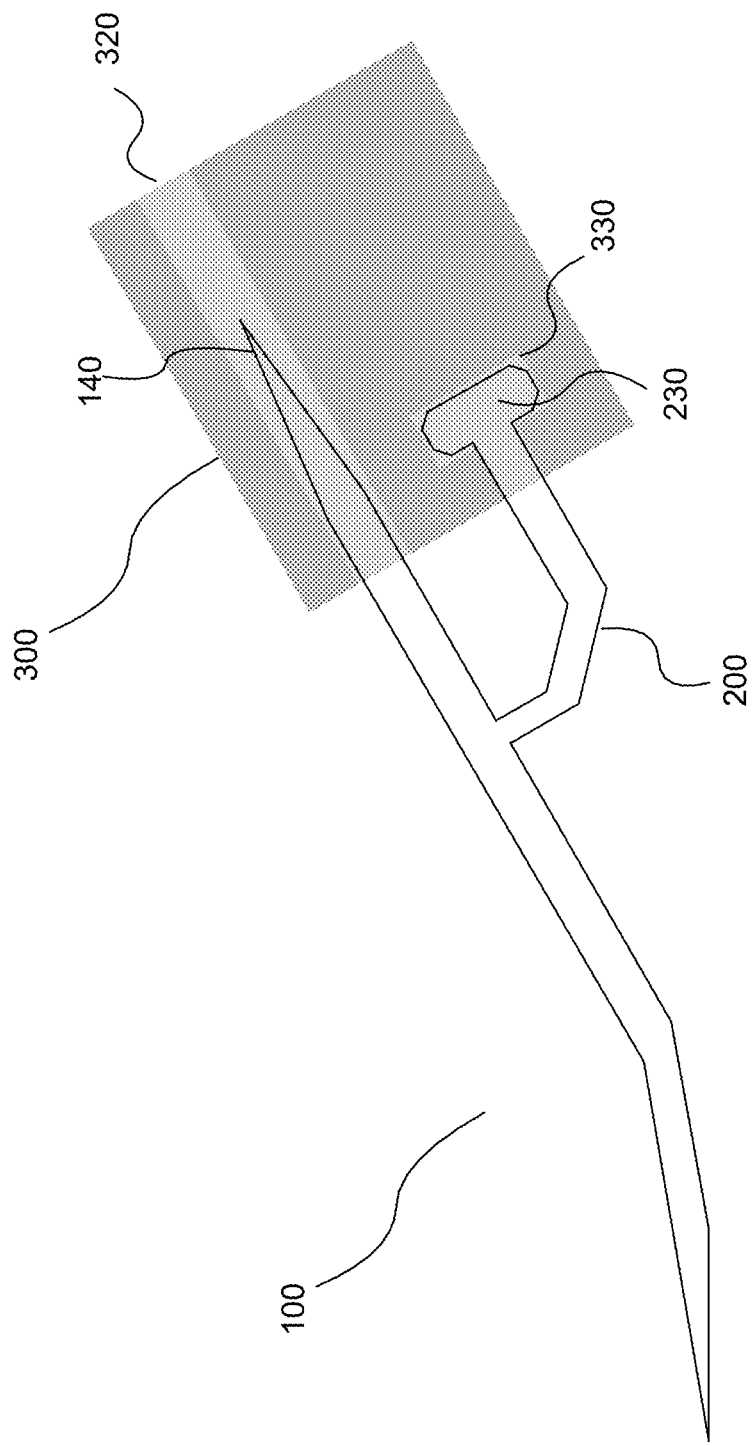
FIG. 4 illustrates a probe when mounted into a matching housing block.

FIG. 4 illustrates an embodiment where the probe 100 has been inserted in the housing block 300. The housing block 300 has an outer geometry allowing it to be attached to a positioning system of a test system that is sufficiently manoeuvrable to place the connected probe's tapered face 120 in contact with a waveguide under study. The assembly of the housing block 300 and the probe 100 can be positioned such that the tapered face 120 is in sufficient contact with the side of a waveguide under study to form an interface through which electromagnetic waves from either side are coupled.

FIG. 4 also illustrates how the probe 100 may be flexibly secured within the housing block 300. In particular, the second channel 330 may be sufficiently larger than the connector 230 to allow some movement in the connection between the probe 100 and the housing block 300 while still allowing for accurate positioning and sufficient contact of the tapered face 120 to the side of a waveguide under study. Allowing a small amount of movement reduces the risk that the probe ruptures when the tapered face 120 is positioned in planar contact with the input portion of the waveguide under study. There may also be a gap between the prong 140 and the first channel cavity 320 to allow for an amount of movement of the prong 140, so as to further reduce the risk of rupture when the tapered face 120 is positioned in planar contact with the input portion of the waveguide under study.

As the coupling of the connector 230 within the second channel 330 of the housing block 300 secures the probe 100 in place, the connection between the prong 140 of the probe 100 and the first channel cavity 320 may be optimized for the transfer of the test signal.

Figure 5:
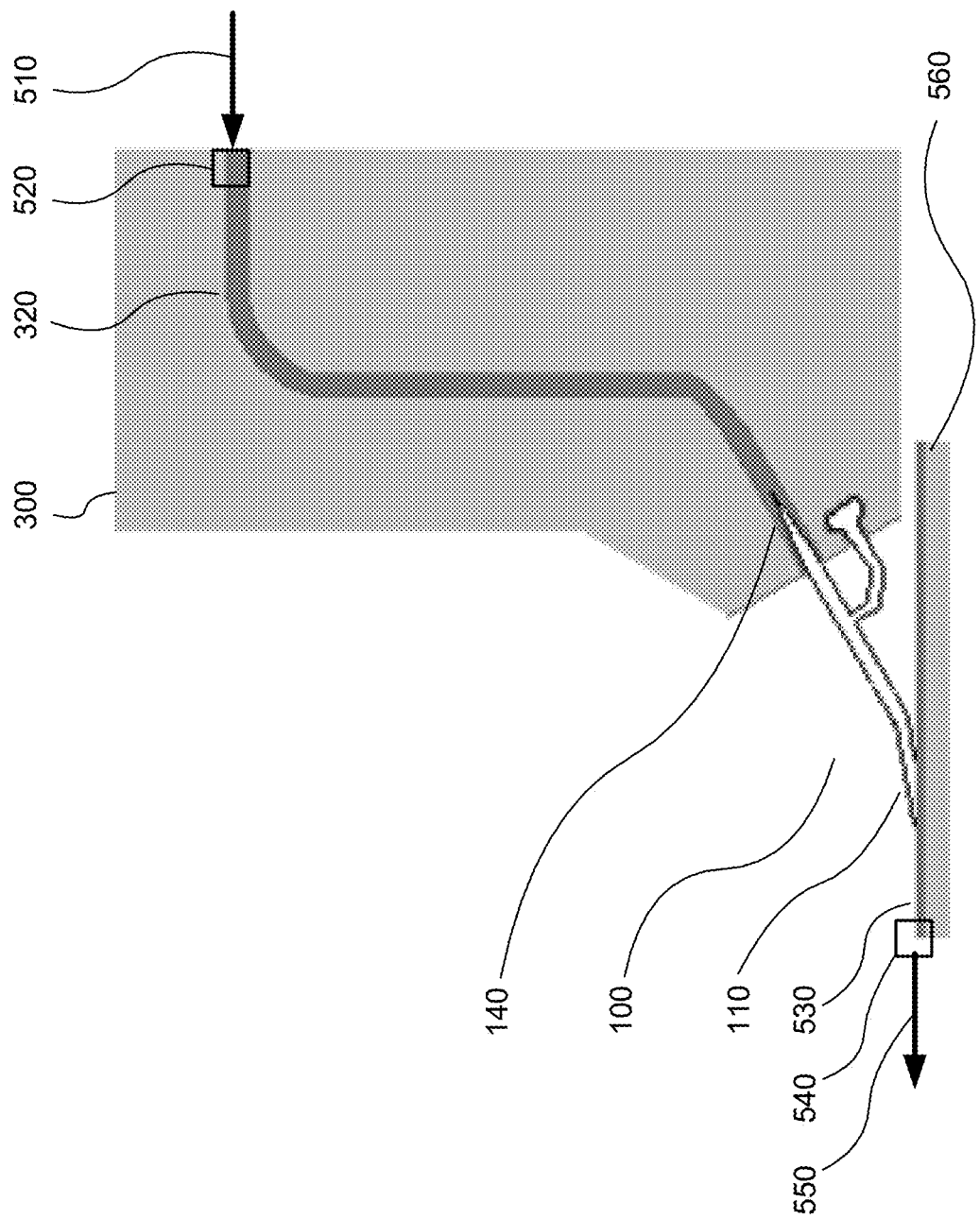
FIG. 5 illustrates a testing assembly including a probe fitted into a matching housing block. The assembly positions the tapered face in contact with a waveguide under study.

FIG. 5 illustrates an embodiment where the assembly of the probe 100 and housing block 300 is used to test a waveguide under study 530. A test signal of electromagnetic waves 510 is introduced via a WR5.1 port 520 in the first channel cavity 320 of a housing block 300. The test signal 510 is transferred through the housing block 300 to the prong 140 of a probe 100. The test signal 510 is then transferred through the probe 100 to the tapered face 120, and across a coupling interface between the tapered face 120 and the SIIG waveguide under study 530. The test signal 510 is transmitted through the waveguide under study 530 and through a SIIG port 540 to produce a measured signal 550 of the waveguide under study 530. The input test signal 510 may be compared to the measured signal 550 to characterize the waveguide under study 530. The SIIG waveguide 530 can typically be formed on or supported by a substrate 560 such as aluminium.

In some embodiments of the present invention, electromagnetic waves of test signal 510 inserted and propagating in the probe 100 undergo several reflections under the effect known in the art as "total internal reflection". The angle 130 in the probe 100 is formed such that "total internal reflection" effect is maintained before and after the angle 130 and energy loss through the sides of the probe 100 are thereby very small, negligible, or nil, such that wave energy is generally confined within the lateral boundaries of the probe 100 and directed to the tapered face 120 of the probe 100. The material of the probe 100 and the angle of the bend 130 of the probe 100, are selected to allow a predetermined range of electromagnetic waves to be confined within the probe 100 via the "total internal reflection" effect, until they reach the tapered face 120 where they are transmitted to the waveguide under study.

Figure 6:
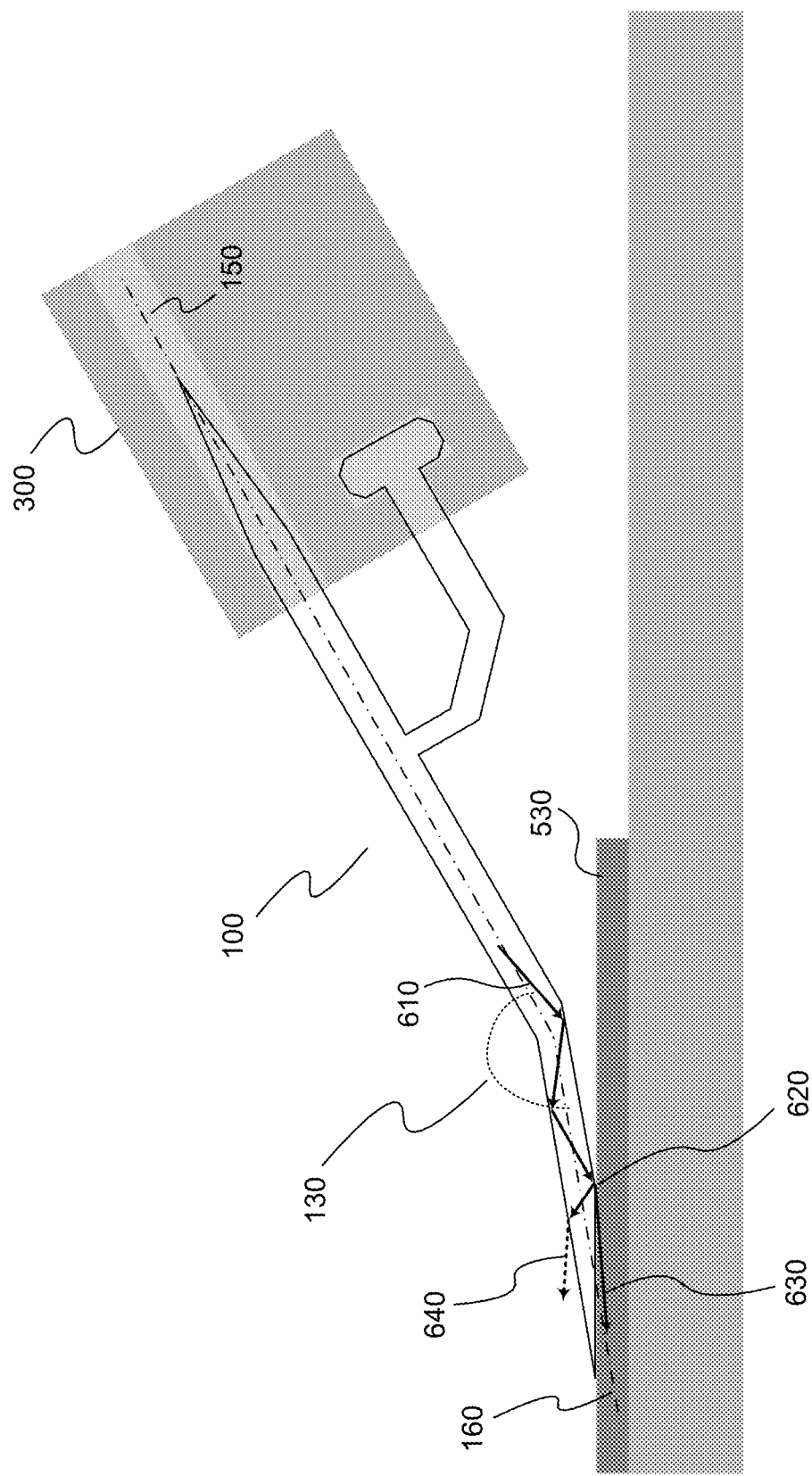
FIG. 6 illustrates a ray of electromagnetic waves undergoing total internal reflection along the probe.

FIG. 6 illustrates an embodiment wherein an electromagnetic wave 610 inside the probe 100 undergoes total internal reflection through the angle 130, until it reaches the tapered face 120 and interface 620 where the tapered face 120 meets the waveguide under study 530. At interface 620, instead of undergoing "total internal reflection", the wave is both transmitted 630 across the coupling interface, and reflected back into the probe to be partially lost by transmission to the surround medium, which may be air, 640, and partially returned as a subsequent transmission across the interface.

Figure 7:
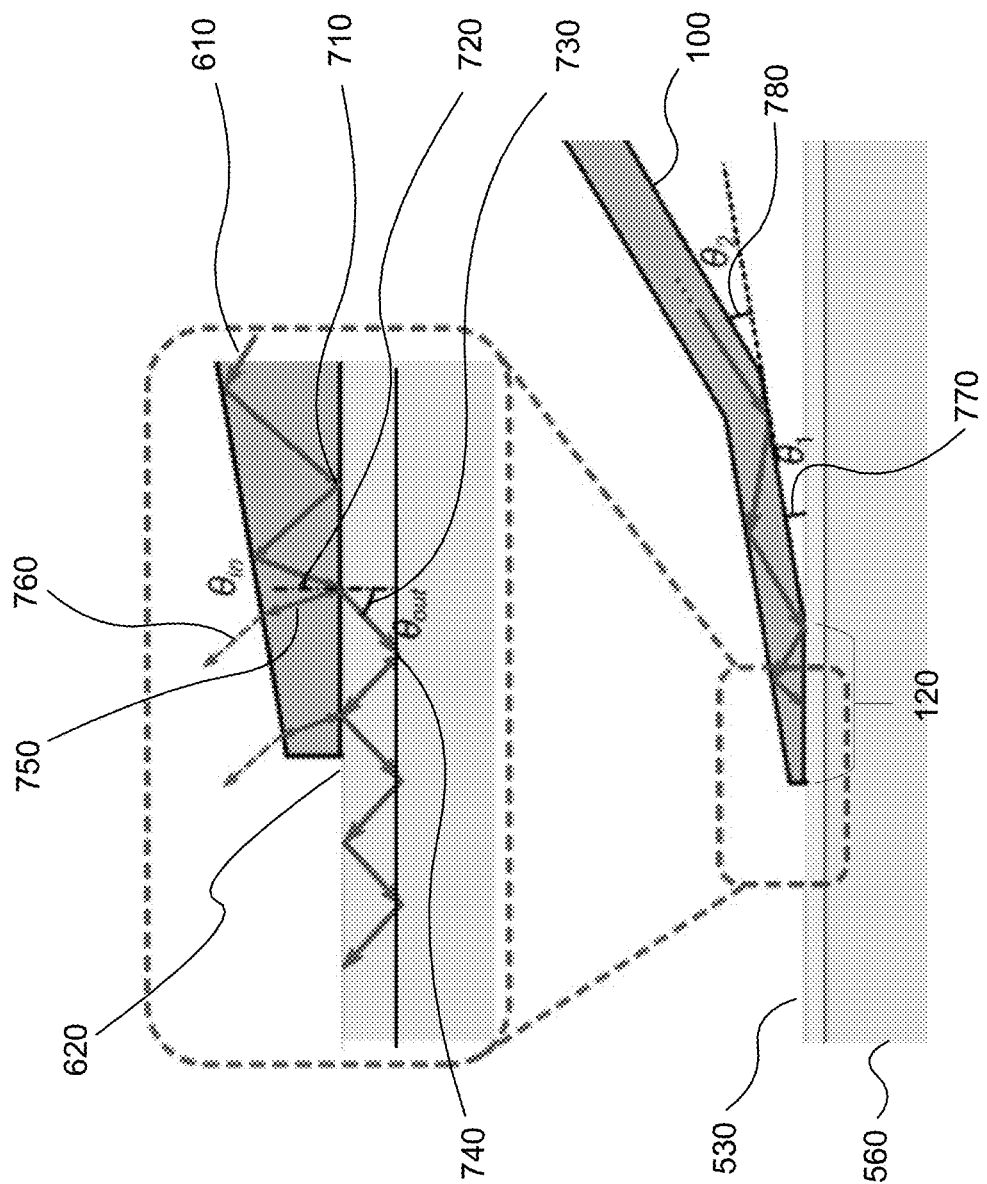
FIG. 7 illustrate a close-up of the interface between the tapered face of a probe and the waveguide under study showing electromagnetic wave reflection and transmission paths, and definitions of the angles used in design equations of the probe.

With reference to FIG. 7, the effect known as "total internal reflection" is satisfied in the probe 100 when the angle of incidence $\theta_{in}$ (720) of a wave 610, upon a face of the probe, is greater than the angle known in this context as the "critical angle $\theta_c$", which is defined by Snell's Law when $\theta_{out}=90°$ (730). Until the ray reaches the interface 710 with a waveguide under study, it is confined within the probe because;

the refractive index of the wave guide is greater than that of the surrounding medium, and the angles of incidence within the probe are greater than the critical angle required for "total internal reflection".

For a wave of a given frequency, a probe 100 of a particular material, having a refractive index $n_{SiDW}$, sharing a common interface with a surrounding medium, such as air, and having a refractive index n, Snell's Law states that the relation between the angle of incidence $\theta_{in}$ 720 and the refraction angle $\theta_{out}$ 730 is:

$$\frac{\sin\theta_{in}}{\sin\theta_{out}} = \frac{n}{n_{SiDW}}$$

For a wave of a given frequency, a probe 100 having a refractive index $n_{SiDW}$ sharing a common interface with a medium such as a SIIG waveguide 530, having a refractive index $n_{SIIG}$, Snell's Law states that the relation between the angle of incidence $\theta_{in}$ 720 and the refraction angle $\theta_{out}$ 730 is given by:

$$\frac{\sin\theta_{in}}{\sin\theta_{out}} = \frac{n_{SIIG}}{n_{SiDW}}$$

The critical angle $\theta_c$ is defined as the value of $\theta_{in}$ 720 for which $\theta_{out}=90°$, such that when $\theta_{in}>\theta_c$, the wave is entirely reflected within the incident medium. In embodiments, the incident medium is the material of the probe 100, such as silicon, so that as long as $\theta_{in}>\theta_c$, and the surface of the tapered face 120 of the probe 100 is sufficiently smooth, the wave 610 is confined within the probe 100. The critical angle at the interface 620 between the tapered face 120 and a waveguide under study 530 can be identified as $\theta_{c1}$ and the critical angle at the interface with a waveguide can be identified as $\theta_{c2}$ 710.

In embodiments, the interfaces between the probe 100 and the surrounding medium, and between the tapered face 120 of the probe 100 and the waveguide under study 530, are sufficiently smooth for the "total internal reflection" effect to be indeed "total" for practical purposes. In other embodiments, the interfaces between the probe 100 and the surrounding medium, and between the probe 100 and the waveguide under study 530, may not be sufficiently smooth to achieve a "total internal reflection" effect, but may still be sufficiently smooth for the probe 100 to serve its intended purpose.

Returning to FIG. 7, a wave 610 of a given frequency is undergoing total internal reflection 710 until it is incident to the interface with a SIIG waveguide at an angle of incidence $\theta_{in}$ 720, which is smaller than the critical angle $\theta_{c2}$ of the interface between the tapered face 120 and the waveguide under study 530. Part of the wave is transmitted at an angle $\theta_{out}$ 730, and keeps undergoing total internal reflection 740 in the SIIG waveguide under study 530, while part of the wave is reflected back into the probe 750, where it keeps being reflected and transmitted either to the surrounding medium as a loss 760, or in the waveguide under study 530 and added to the signal transmitted through the waveguide under study 530. The loss of energy by transmission to the surrounding medium 760 is decreased when the quality of the contact between the tapered face 120 and waveguide under study 530 at interface 620 is increased and approaches an ideal coupling interface.

In some embodiments, the angle $\theta_{in}$ 720 at which a wave is incident upon the interface 620 is a function of the angle $\theta_1$ 770 of the probe's tapered face 120, and the angle $\theta_2$ 780 of the bend 130 in the probe 100, and the relation is given by:

$$\theta_{in}=90°-n\cdot\theta_1-\theta_2, \; n=1,3,5,\ldots \quad (1)$$

In FIG. 7, the angle $\theta_{in}$ 720 at which a wave 610 is incident upon the interface 620 is a function of the angle $\theta_1$ 770 of the probe tip's tapered face 120, and the angle $\theta_2$ 780 of the bend in the probe. In some embodiments where the wave 610 frequency is 200 GHz, $\theta_1=10°$, and $\theta_2=20°$. In other embodiments, the critical angle at the probe/surrounding medium interface is 19.2°.

Snell's Law may be expressed as:

$$\frac{\sin\theta_{in}}{\sin\theta_{out}} = \frac{\beta_{SIIG}}{\beta_{SiDW}} = \frac{\beta_{SIIG}/k_0}{\beta_{SiDW}/k_0} \quad (2)$$

where:

$\theta_{out}$ is the angle of refraction in a SIIG, $$k_0 = \frac{2\pi}{\lambda_0}$$

is the wavenumber or the wave in vacuum, $\lambda_0$ is the wavelength of the wave in vacuum, $\beta_{SIIG}/k_0$ is the SIIG normalized phase constant, and $\beta_{SiDW}/k_0$ is the SiDW normalized phase constant.

In some embodiments, typical values of the parameters above are given as; $\beta_{SIIG}/k_0$ is approximately 1.42 and $\beta_{SiDW}/k_0$ is approximately 3.04.

In some embodiments, when the incident angle in the area within the probe where signals propagate is less than the critical angle ($\theta_{c1}$=27.8°, at a frequency of 200 GHz), then the wave propagates in the SIIG waveguide.

In some embodiments where the frequency is 200 GHz, meeting the above requirement requires the refractive index of the probe to be n=5, $\theta_{in}$=20° and $\theta_{out}$=47°.

In some embodiments of the present invention, the wave 610 in the waveguide under study 530 undergoes the effect known as "total internal reflection" at the intersection of the waveguide under study 530 and the tapered face 120, and at the boundary of the waveguide under study 530 and its substrate 560, such that the wave propagating in the waveguide under study 530 between the surrounding medium and the substrate 560 can be identified as a forced wave and its propagation mode can be identified as the $E_{11}{}^y$ mode.

For any dielectric probe 100 design, a suitable material will be chosen according to the two critical angles $\theta_{c1}$ and $\theta_{c2}$. Then the designer will choose the geometric size of the dielectric waveguide for the probe to satisfy equations (1) and (2), above.

In some embodiments, the return loss for the $E_{11}{}^y$ mode across a SIIG port 540 may be better than 17 dB, and the return loss for the $E_{11}{}^y$ mode across a WR5.1 waveguide port 520 is better than 17 db. The insertion loss for a $E_{11}{}^y$ mode across a silicon probe 100 and a waveguide under test 530 is approximately 5.8 dB. The insertion losses for a $E_{21}{}^y$ mode across a silicon probe and a WR5.1 waveguide port is approximately 61 dB, and the $E_{21}{}^y$ mode can therefore be neglected.

Figure 8:
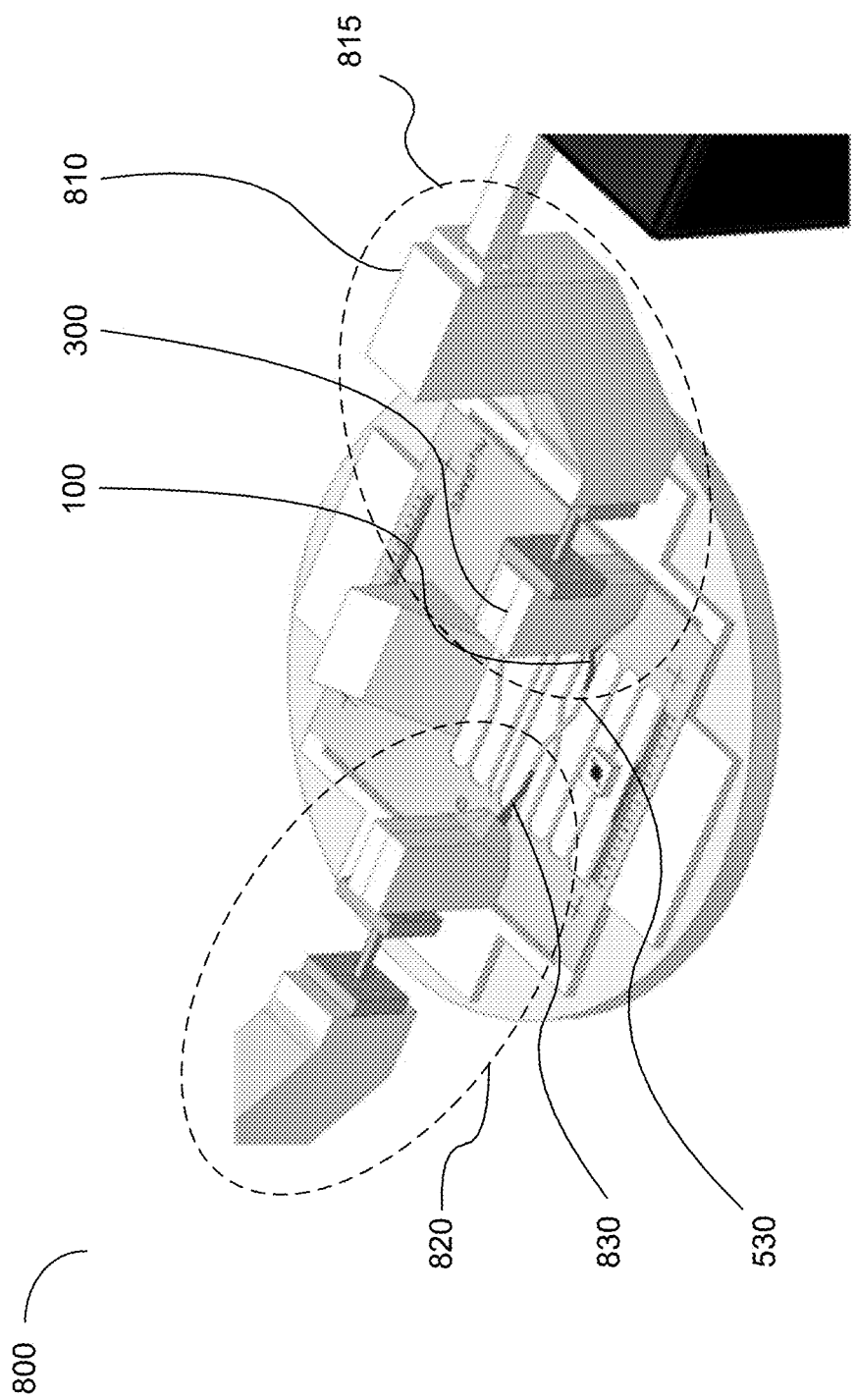
FIG. 8 illustrates an embodiment where a test system is assembled to make measurements of a waveguide under study.

FIG. 8 illustrates a test system 800 to perform methods to characterize a waveguide under study 530 according to embodiments. A probe 100 is mounted in a housing block 300. The housing block 300 is mounted onto a positioning system 810 incorporating or receiving a test signal 510 that includes a wave source. The assembly 815 of the probe 100, the housing block 300, and the positioning system 810, is positioned such that the tapered face 120 of the probe 100 is in contact with the waveguide under study 530. A second assembly 820 is positioned such that its probe 830, which may be identical to probe 100, is in contact on an opposing location along the waveguide under study 530 to collect exiting waves and transfer the waves towards a measuring apparatus that interfaces with second assembly 820.

Figure 9:
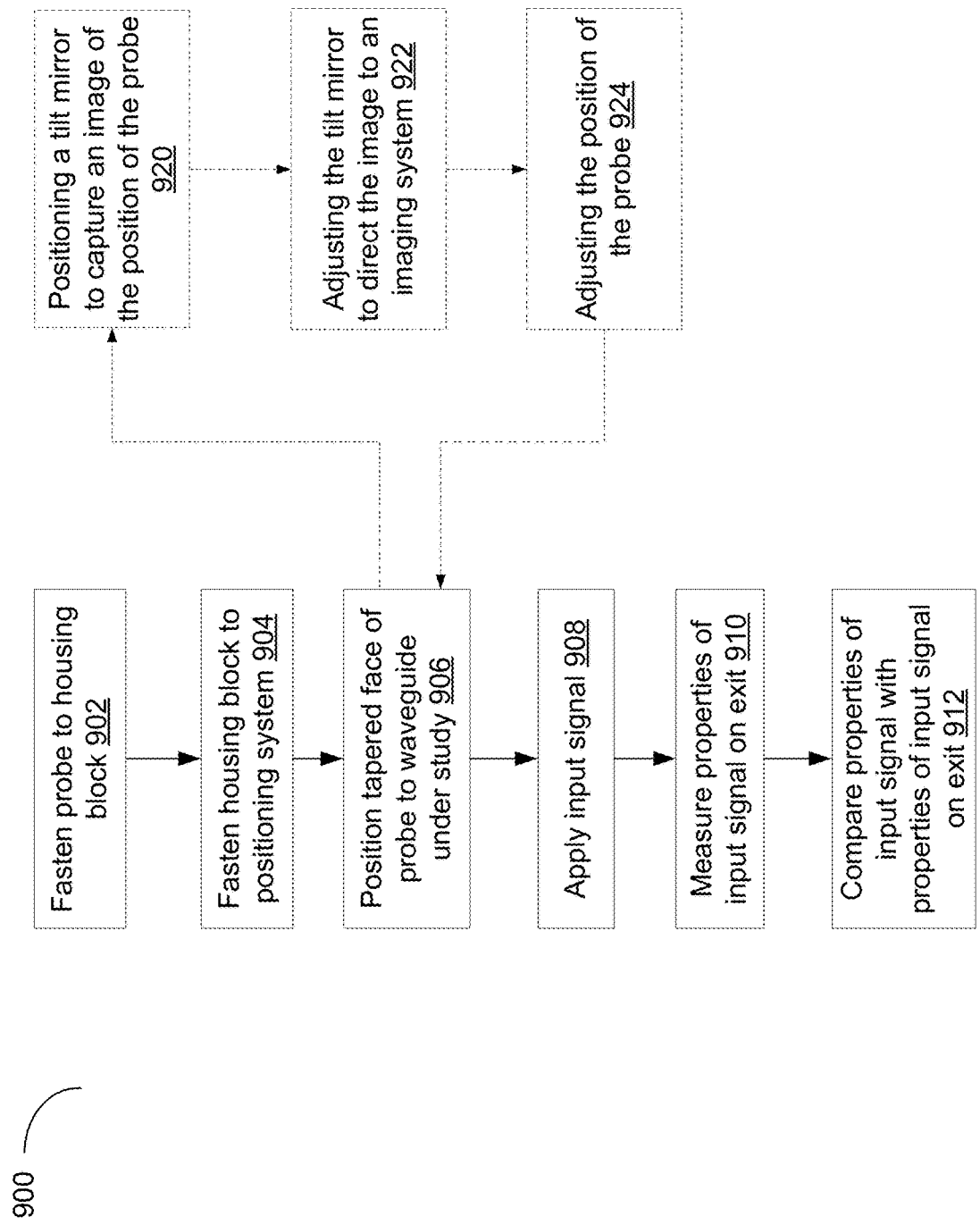
FIG. 9 illustrates a method to make measurements of a waveguide under study utilizing a probe and housing block according to embodiments.

FIG. 9 illustrates a flowchart 900 of a method to characterize a waveguide under study 530 using a test system such as test system 800 shown in FIG. 8 that includes the probe 100 and housing block 300. The method starts in step 902 by fastening the probe 100 to the housing block 300. This may be accomplished by placing the probe in the first part 310 of the housing block 300 so that the waveguide transition 140 is positioned in the first channel cavity 320 and the T-shaped connector 230 is positioned in the second channel 330. The second part 340 of the housing block 300 is then fixed to the first part 310, holding the probe 100 in place. The housing block is also fastened to positioning system 810 in step 904. In some embodiments the order of steps 902 and 904 may be reversed. The probe 100, the housing block 300, and the positioning system 810 form an assembly 815. In step 906, the assembly 815 is then used to position the tapered face 120 of the probe 100 in planar contact with an input portion of the waveguide under study 530. In step 908, a test signal is input to the assembly 815 and is transferred through the housing block 300, to the probe 100. The test signals are transferred through the interface between the tapered face 120 into the waveguide under study 530. In step 910, the second assembly 820 receives the input test signal and measures or calculates properties of the received signal. In step 912, the measures properties of the received signal are compared to the input signal to product data to determine or verify the characteristics of the waveguide under test 530.

Optionally, step 906 may utilize a tilt mirror in order to position the tapered face 120 to the waveguide under study 530. This is illustrated in FIG. 10 and FIG. 11.

Figure 10:
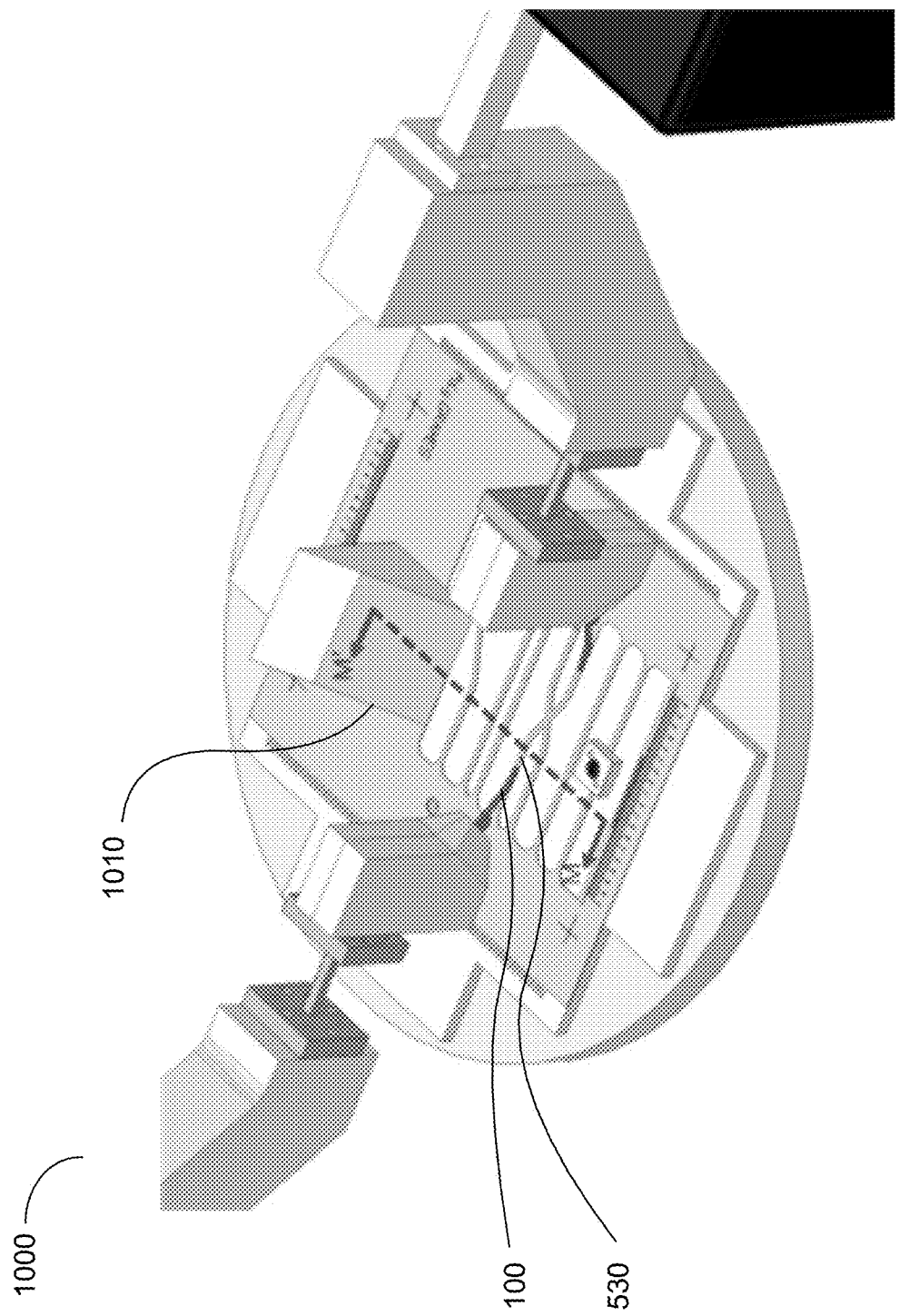
FIG. 10 illustrates an embodiment where a test system is assembled to make measurements of a wave guide under study and a mirror is positioned to reflect an image of the probe and waveguide interface.

FIG. 10 illustrates an embodiment of a test system 1000 in which a tilt mirror 1010 is installed in the vicinity of a probe 100 and the waveguide under study 530 to monitor the contact interface 620 between the tapered face 120 of the probe 100 and an input portion of the waveguide under study 530. The tilt mirror 1010 can be positioned to redirect the image of the interface 620 towards an optical system which can either be the human eye, a microscope, a camera, another imaging system, or a combination thereof. Furthermore, where a second probe 830 is part of the setup, the mirror 1010 can be repositioned to collect the image of the second probe 830 or a second mirror may be used. The image of probe/waveguide interfaces can be viewed in real time to help position the probe, 100 or 830, on the surface of the measured waveguide 530.

Figure 11:
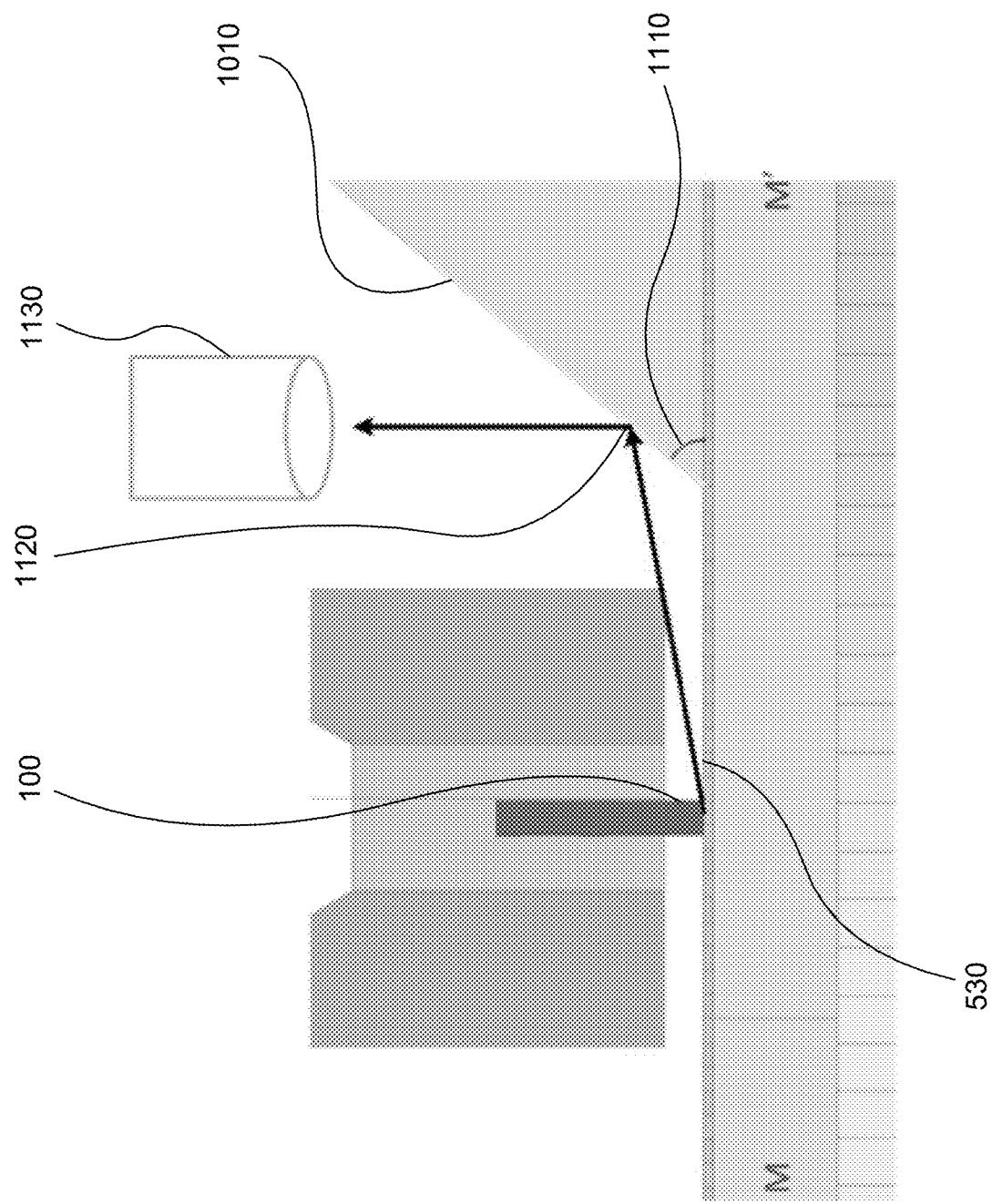
FIG. 11 illustrates a cross-section of a measurement where an image of the interface between the probe and waveguide under study is reflected toward an arbitrary optical system that allows viewing of the probe position.

FIG. 11 illustrates a close-up view of test system 1000, along the plane identified by M-M' in FIG. 10. The position of a tilt mirror 1010, and its angular coordinates, one of which is represented at 1110, are selected to capture an image of the interface between the measured waveguide 530, and the probe 100, and to redirect 1120 the image toward an imaging system 1130, such as an optical system.

Figure 12:
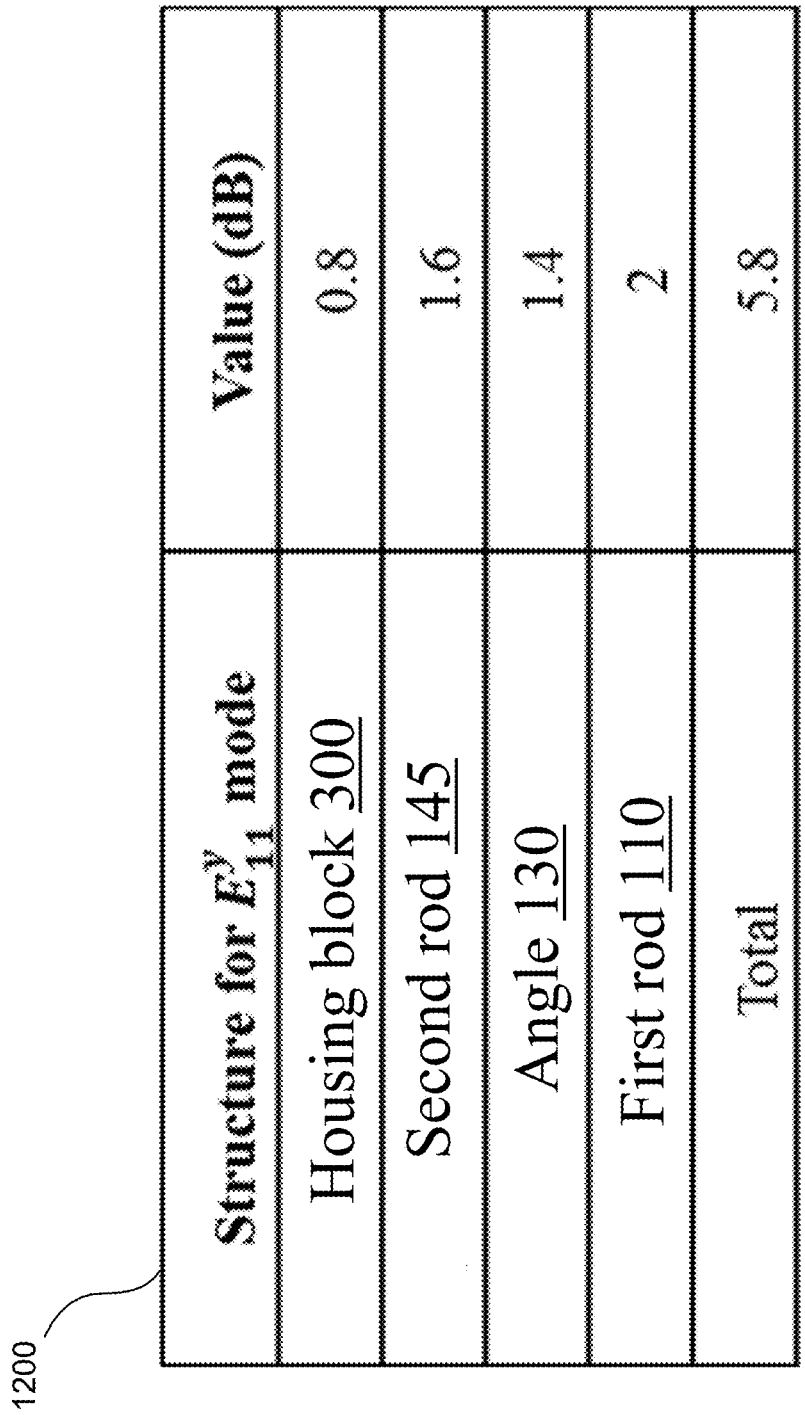
FIG. 12 illustrates a table of measured loss values for test system including a probe according to an embodiment.

Table 1200 of FIG. 12 illustrates the insertion loss of a probe 100 according to an embodiment. Table 800 lists the insertion loss of a housing block 300 and silicon probe 100 when operating at 200 GHz. The loss for the portions of the probe 100; the second rod 145, the angle 130, and the first rod 110 are shown. In this embodiment, the total insertion loss for a combined probe 100 and housing block 300 is 5.8 dB.

Figure 13:
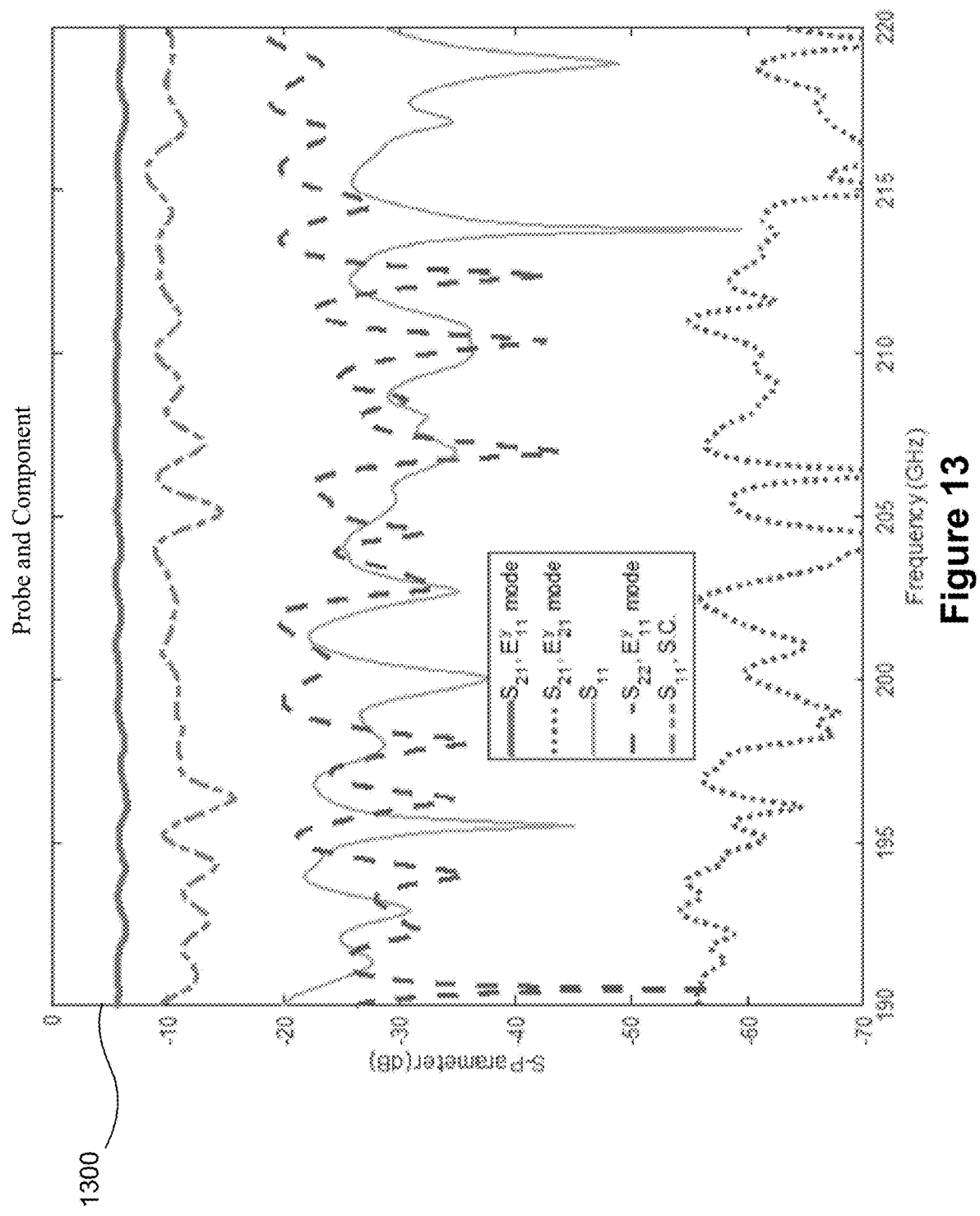
FIG. 13 illustrates a graph showing measured and simulated scattering loss values for an embodiment.

Utilizing the method 900 and the apparatus comprising the probe 100 and housing block 300, a waveguide under study 530 may be characterized in a variety of ways. FIG. 13 illustrates the measurement of scattering loss S-parameters of a probe 100 and SIIG waveguide under study 530 for a range of frequencies and for different modes. Using the scattering loss S-parameters, the attenuation constant, a, and the phase constant, β, of the waveguide under study 530 can be measured for a range of wavelengths by:

$$\begin{cases} \alpha = -\dfrac{|S_{21}^M|}{L_M - L_T} \\ \beta = -\dfrac{\angle S_{21}^M - 2\pi \cdot N}{L_M - L_T} \end{cases} \quad (3)$$

where:

$|S_{21}{}^M|$ is the magnitude of the scattering component $S_{21}$ of the waveguide under study, $\angle S_{21}{}^M$ is the phase of the scattering component $S_{21}$ of the waveguide under study, $L_M$ is the length of the waveguide under study, $L_T$ is the length of the thru of a waveguide TRL kit, N is the minima integer of $(L_M-L_T)/\lambda_g$ As an example, for some SIIG waveguides the lengths are approximately: $L_M \approx 25.4$ mm$\approx 1000$ mil, and $L_T \approx 9.14$ mm$\approx 360$ mil. Furthermore, the attenuation constant of a SIIG waveguides, measured over the range between 190 GHz and 220 GHz, is 0.241±0.057 dB/mm.

Figure 14:
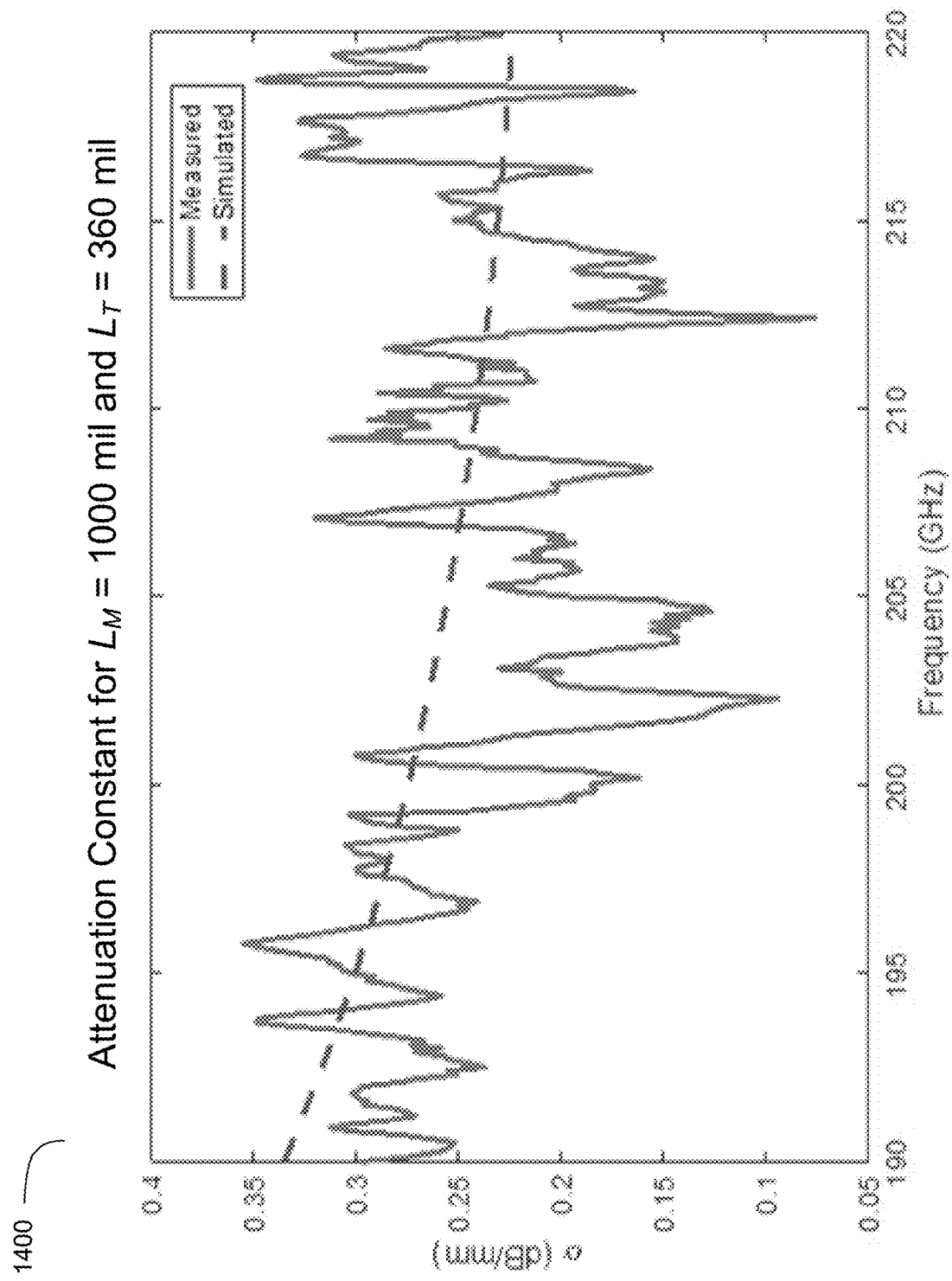
FIG. 14 illustrates a graph showing measured and simulated attenuation constants for an embodiment.
Figure 15:
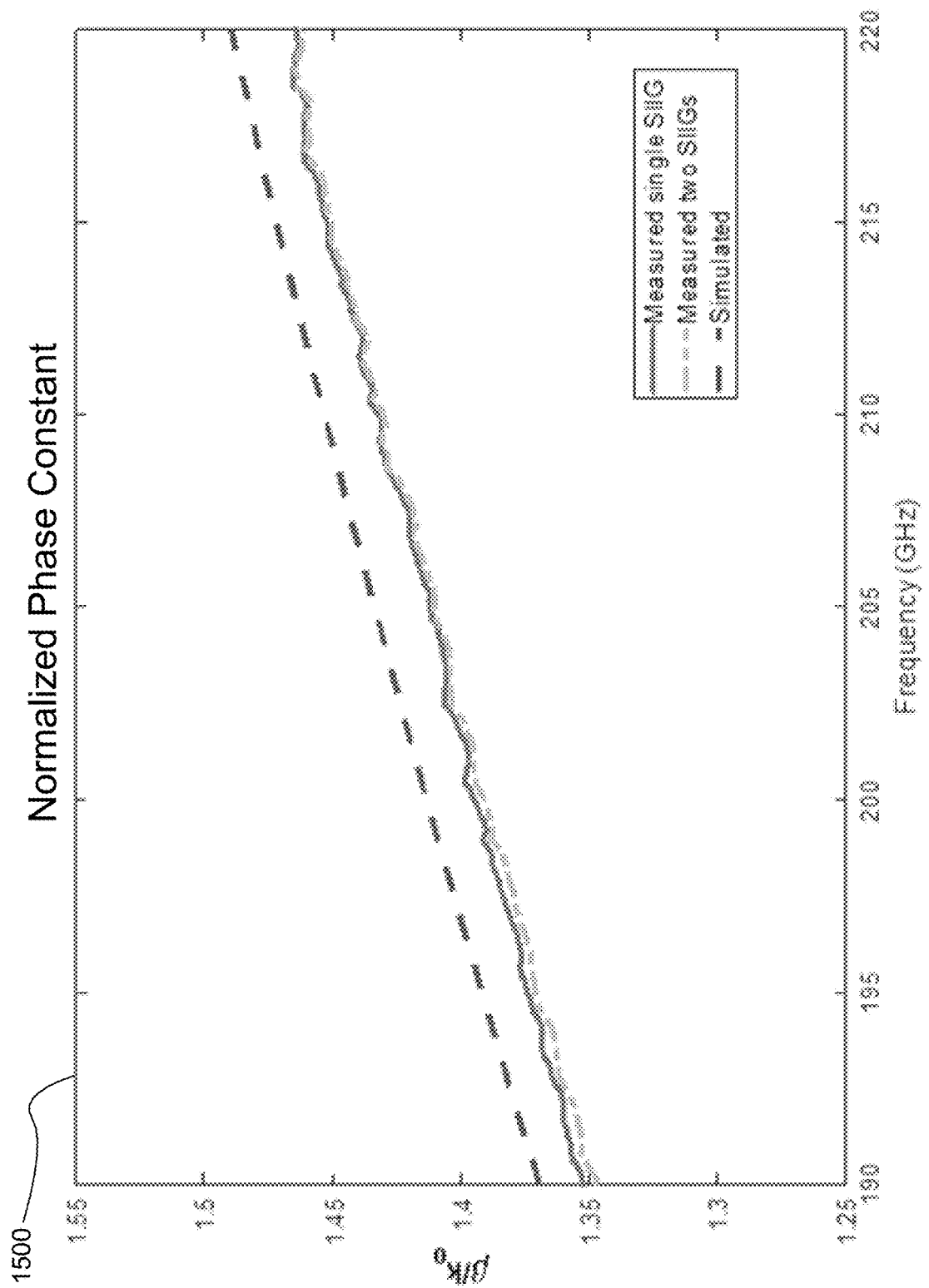
FIG. 15 illustrates a graph showing measured and simulated normalized phase constants for an embodiment.

FIG. 14 illustrates a graph 1400 showing the results of measuring the attenuation constant of a SIIG waveguide under study 530 for a range of wavelengths, when $L_M \approx 25.4$ mm$\approx 1000$ mil and $L_T \approx 9.14$ mm$\approx 360$ mil, and the results are compared with those of a simulation.

Utilizing the method 900 and the apparatus comprising the probe 100 and housing block 300 a waveguide under study 530 may be measured to determine the normalized phase constant $\beta/k_0$ of the waveguide under study 530 for a range of wavelengths. As seen in FIG. 14, the normalized phase constant of a SIIG waveguide, measured over the range between 190 GHz and 220 GHz, varies from 1.35 to 1.46, which is lower than a simulated value, the relative difference being 1.5% between the measured and simulated value. A possible reason for the relative difference of 1.5% is that the substrate for the SIIG waveguide under study 530 and the substrate 560 for the measurement of permittivity originate from different batches of substrate material.

In some embodiments, instead of mounting the combined probe 100 and housing block 300 on to a test system 800, the probe 100 and housing block 300 can be mounted onto the components of a standard Thru Reflect Line (TRL) Waveguide Calibration kit. In other embodiments, the combined probe 100 and housing block 300 can be mounted onto a VDI WR 5.1 band extender and a Keysight PNA-X N5274A Vector Network Analyzer (VNA), which are used to provide the sources and vector detectors of the measurement system over 190-220 GHz. In other embodiments, the combined probe 100 and housing block 300 can be mounted on a VDI WR5.1 extender and a Suss microtech semi-automatic probing station.

As used herein, the terms "about" and "approximately" should be read as including variation from the nominal value, for example, a ±10% variation from the nominal value. It is to be understood that such a variation is always included in a given value provided herein, whether or not it is specifically referred to.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. A probe comprising:
   a first rod having a first axis; and
   a second rod having a second axis, a first end of the first rod being connected to a first end of the second rod to form an angle that maintains a "total internal reflection" effect for waves propagating through the probe, a second end of the second rod comprising a prong, the prong facilitating attachment of the probe to a housing block, the first axis and the second axis defining a plane, a second end of the first rod comprising a tapered face formed perpendicular to the plane, the tapered face sufficiently flat to make planar contact with a portion of a component.

2. The probe of claim 1, further comprising a support formed in the plane, a first end of the support connecting to the second rod, a second end of the support comprising a connector to facilitate attachment of the probe to the housing block.

3. The probe of claim 2, further comprising the housing block in which a first channel cavity and a second channel cavity are formed, the first channel cavity shaped to receive the prong, the second channel cavity shaped to receive the connector.

4. The probe of claim 3, wherein the housing block has an outer geometry allowing the housing block to be fastened to a positioning system to position the tapered face to be in planar contact with the portion of the component and to allow for the transmission of the waves from the tapered face to the portion of the component.

5. The probe of claim 3, wherein, with the prong inserted into the first channel cavity, a gap is formed between an outer surface of the prong and the first channel cavity, the gap allowing an amount of movement of the prong, so as to reduce the risk that the probe ruptures when the tapered face is positioned in planar contact with the portion of the component.

6. The probe of claim 3, wherein, with the connector inserted into the second channel cavity, a gap is formed between an outer surface of the connector and the second channel cavity, the gap allowing an amount of movement of the connector, so as to reduce the risk that the probe ruptures when the tapered face is positioned in planar contact with the input portion of the component.

7. The probe of claim 2, wherein the support is connected to the second rod at a 90-degree angle.

8. The probe of claim 2, wherein the connector is shaped to prevent movement of the probe in the direction of the second axis when the probe is attached to the housing block.

9. The probe of claim 1 wherein the first rod and the second rod are composed of a material transparent to the waves.

10. The probe of claim 9, wherein the material comprises dielectric silicon.

11. The probe of claim 1 wherein the waves are of wavelengths from microwave to optical radiation.

12. The probe of claim 1 wherein the first rod and the second rod have a rectangular cross section.

13. The probe of claim 12, wherein a thickness of the rectangular cross-section is between 0.1 mm and 3 mm.

14. The probe of claim 1, wherein a width of the prong narrows in a direction of the second end of the second rod.

15. The probe of claim 1, wherein the angle is between 0 and 20 degrees.

16. A method to measure the properties of a component at a range of frequencies, the method comprising:
   fastening a probe to a housing block, the probe comprising
   a first rod having a first axis; and
   a second rod having a second axis, a first end of the first rod being connected to a first end of the second rod to form an angle that maintains a "total internal reflection" effect for waves propagating through the probe, a second end of the second rod comprising a prong facilitating attachment of the probe to the housing block, the first axis and the second axis defining a plane, a second end of the first rod comprising a tapered face formed perpendicular to the plane, the tapered face sufficiently flat to make planar contact with a portion of a component;

fastening the housing block to a positioning system;
manipulating the positioning system to position the tapered face to make planar contact with the portion of the component;
apply a test signal comprising the waves, to the positioning system;
measuring properties of the test signal exiting the component;
comparing properties of the test signal exiting the component with properties of the test signal.

17. The method of claim 16, further comprising:
positioning a tilt mirror to capture an image of an interface between the tapered face and the portion of the component; and
manipulating the positioning system to position the tapered face to reduce a distance between the tapered face and the portion of the component.

18. A probe for transmitting a test signal having a predetermined wavelength into a waveguide, the probe comprising:
a first segment, composed of a dielectric material, having a thickness, a central axis and a face set at a bias to the central axis of the first segment, the face at a first end of the first segment; and
a second segment, composed of the dielectric material, having a thickness and a central axis, and a first end connected to a second end of the first segment, distal to the first end of the first axis, the central axis of the second segment and the central axis of the first segment forming an intersection having an angle of intersection;

wherein:
a dielectric constant associated with the dielectric material and the thickness of the second segment are selected in accordance with the predetermined wavelength to permit total internal reflection of the test signal when propagated through the second segment,
the thickness of the first segment and the angle of intersection are selected in accordance with the predetermined wavelength to permit total internal reflection of the test signal propagated through the second segment into the first segment,
an angle between the face set at a bias and the central axis of the first segment is selected to permit transmission of the test signal into the waveguide, and
the second segment has, at a second end, distal to the first end of the second segment, a connector end for interfacing the probe with a housing, wherein the connector end is shaped for insertion into the housing.

19. The probe of claim 5 wherein the first and second segments are composed of a silicon-based dielectric material and the thickness of the second segment is the same as the thickness of the first segment.

20. The probe of claim 5 wherein the angle between the face set at a bias and the central axis of the first segment is further selected to permit transmission out of the first segment of a reflection associated with transmission of the test signal into the waveguide.

21. The probe of claim 5 wherein the first and second segments are integrally formed.

* * * * *